(12) United States Patent
Kilian et al.

(10) Patent No.: US 7,015,557 B2
(45) Date of Patent: Mar. 21, 2006

(54) HALL ELEMENT WITH SEGMENTED FIELD PLATE

(75) Inventors: Wayne T. Kilian, Richardson, TX (US); James R. Biard, Richardson, TX (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/826,746

(22) Filed: Apr. 16, 2004

(65) Prior Publication Data

US 2005/0230769 A1    Oct. 20, 2005

(51) Int. Cl.
*H01L 29/82* (2006.01)

(52) U.S. Cl. ............... 257/421; 257/422; 257/488
(58) Field of Classification Search ........... 257/425, 257/421, 422, 488; 438/454; 338/32.11; 324/252
See application file for complete search history.

(56) References Cited

U.S. PATENT DOCUMENTS

| | | | |
|---|---|---|---|
| 4,048,648 A | 9/1977 | Vinal | |
| 4,727,323 A | 2/1988 | Zabler | |
| 4,931,719 A | 6/1990 | Murata et al. | 323/368 |
| 5,652,445 A | 7/1997 | Johnson | 257/295 |
| 6,069,560 A | 5/2000 | Larsson | 340/540 |
| 6,195,228 B1 | 2/2001 | Bennett et al. | 360/112 |
| 6,265,864 B1 | 7/2001 | De Winter et al. | 324/207.2 |
| 6,423,553 B1 | 7/2002 | Johnson | 438/3 |
| 6,492,697 B1 | 12/2002 | Plagens et al. | 257/426 |
| 6,646,315 B1 | 11/2003 | Johnson et al. | 257/429 |
| 6,683,359 B1 | 1/2004 | Johnson et al. | 257/421 |

FOREIGN PATENT DOCUMENTS

| | | |
|---|---|---|
| DE | 2333080 | 1/1975 |
| WO | PCT/JP02/10164 | 4/2003 |

OTHER PUBLICATIONS

Munter, P., "Spinning-Current Method for Offset Reduction in Silicon Hall Plates", Delft University Press, Delft, The Netherlands, (1992), 1-149.

*Primary Examiner*—Sara Crane
(74) *Attorney, Agent, or Firm*—Kris T. Fredrick

(57) ABSTRACT

A Hall element is provided with a segmented field plate. Dynamic bias control is applied to the segments of the field plate. In one embodiment, a feedback signal is derived from an amplified output of the Hall element. The feedback signal is applied to the segments of the field plate in order to control sheet conductivity in specific localized areas. In one embodiment, a metal field plate is split into four segments along lines between bias and sense contacts of the Hall element. Opposing diagonal segments are electrically connected.

24 Claims, 3 Drawing Sheets

HALL ELEMENT WITH SEGMENTED FIELD PLATE

FIELD OF THE INVENTION

The present invention relates to Hall elements, and in particular to a Hall element with a segmented field plate.

BACKGROUND OF THE INVENTON

The Hall effect occurs when a conductor carrying current is placed in a magnetic field. A voltage is generated according to the cross product of the field and flow of current. Sensors operating on the Hall effect can be modeled like a Wheatstone bridge. In a typical Hall element design, a conductive field plate is affixed to the conductor over an insulating layer. The field plate has a static bias applied to control localized surface-charge-induced offsets.

SUMMARY OF THE INVENTION

A Hall element is provided with a segmented field plate. Dynamic bias control is applied to the field plates. In one embodiment, a feedback signal is derived from an amplified output of the Hall element. The feedback signal is applied to the segments of the field plate in order to control sheet conductivity in specific localized areas.

In one embodiment, a superimposed analog of the Hall-effect magnetic response is provided by unbalancing the conductance of the Hall element acting as a Wheatstone bridge. In one embodiment, the segments of the field plate comprise two field plates, each covering two diagonally adjacent quadrants of the Hall element. In a further embodiment, a metal field plate is split into four segments along lines between bias and sense contacts of the Hall element. Opposing diagonal segments are electrically connected.

DETAILED DESCRIPTION OF THE INVENTION

In the following description, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

Figure 1:
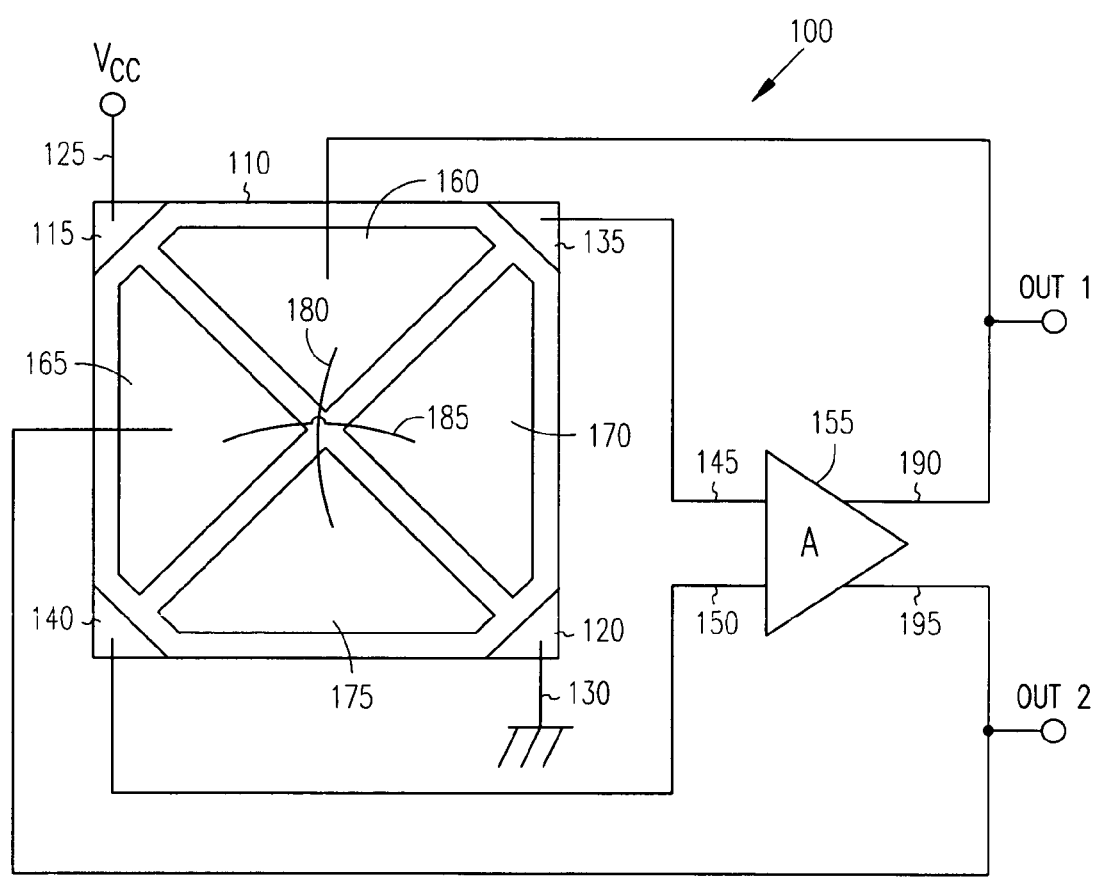
FIG. 1 is a block schematic diagram of a Hall sensor with a segmented field plate according to an embodiment of the invention.

A Hall sensor is shown at 100 in FIG. 1. The Hall sensor 100 comprises a conductive Hall element 110 in a generally square shape. Bias contacts 115 and 120 are coupled to a supply 125 and ground 130 to bias the Hall element 110. Bias contacts are formed at opposite corners of the Hall element to electrically couple the Hall element to the supply and ground. Ground 130 serves to sink current from the Hall element 110.

Sense contacts 135 and 140 are formed on opposite corners of the Hall element 110. The sense contacts 135 and 140 are coupled to positive and negative inputs 145, 150 of a differential amplifier 155.

A segmented or partitioned field plate is formed of four segments or partitions, 160, 165, 170 and 175. In one embodiment, the segments are substantially triangular in shape, with each one formed over a separate quadrant of the Hall element 110 delineated by lines between the bias and sense contacts. Opposing diagonal segments are electrically connected by interconnects 180 and 185. Two of the segments, 160 and 165, on opposite sides of a line between the bias contacts on the voltage source side of the Hall element are coupled to positive 190 and negative 195 outputs of differential amplifier 155 to provide dynamic feedback to the segmented field plate.

Figure 2:
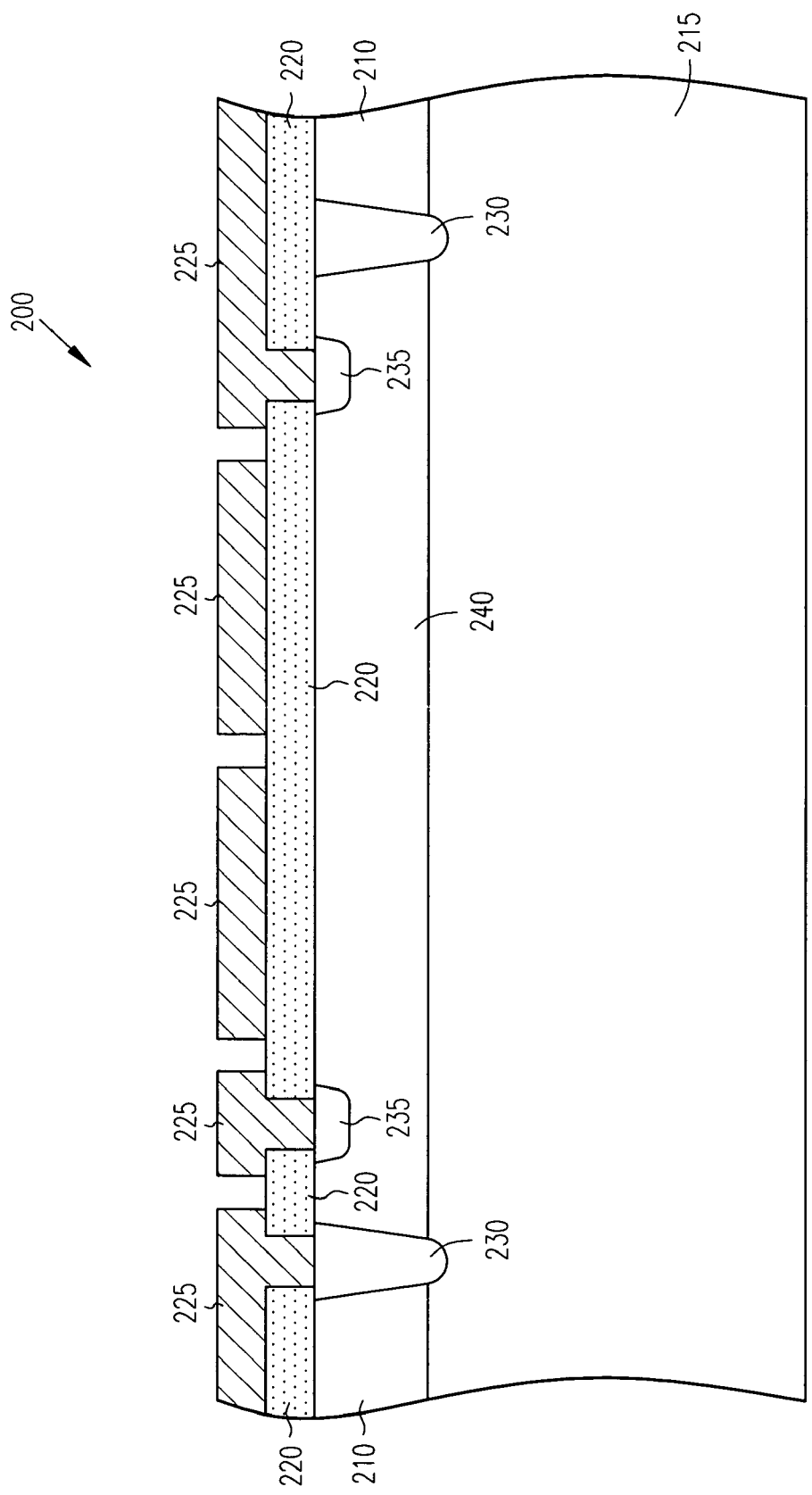
FIG. 2 is a block cross section representation of a Hall sensor with a segmented field plate according to an embodiment of the invention.

A cross section representation of the Hall sensor is shown at 200 in FIG. 2. A Hall element 240 in one embodiment comprises a thin N-doped epitaxial layer 210 and 240 on a P-type substrate 215. An insulating layer 220 formed of $SiO_2$ in one embodiment is on top of the N-type epitaxial layer 210 and 240. The field plate is formed of an electrically conductive layer 225 on top of the insulating layer 220. In one embodiment, the conductive layer 225 is formed of aluminum. The insulating layer is approximately 5000 Angstrom thick in one embodiment, but may be thicker or thinner as desired. Thinner layers may provide a stronger field effect, having the same result as higher gain amplification by the differential amplifier 155 in FIG. 1. Amplifier gains are typically in the 200 to 500 range. Smaller plate segments, a thicker insulating layer or reduced amplifier gain may also be used to decrease sensitivity.

Segments of the field plate and electrical interconnections are isolated from each other by selectively removing areas of the electrically conductive layer 225. The Hall element 240 is defined within the N-type epitaxial layer 210 and 240 by P-doped areas 230 extending down into the N-type epitaxial layer toward the P type substrate 215. In one embodiment, the P-doped isolation regions extend into the P-type substrate 215 a distance sufficient to isolate the Hall element 240 from the other N-type epitaxial regions 210. Other means of isolating the segments may be provided. In one embodiment, ohmic contacts to the Hall element 240 are provided by heavily N-doped regions 235. Regions of the conductive layer 225 comprising electrical interconnections have conductive paths formed by openings in the insulating layer 220 to the Hall element contacts 235 and isolation regions 230.

The Hall element normally has an N-type accumulation layer on its surface due to the Qss in the surface oxide. The segments of the metal field plate are on top of this surface oxide layer. The structure can be modeled as a Wheatstone bridge comprised of N-channel, depletion mode MOSFETs wherein the segments of the metal field plate act as the MOSFET gates. Changing the bias on the segments of the metal field plate changes the thickness of the surface accumulation layer, producing a change in the sheet conductivity of the N-type silicon. The quadrants of the Hall element representing the resistive branches of a Wheatstone bridge are modulated by the voltage potentials applied to the segments of the field plate. The diagonal segments of the field plate are driven differentially by an amplified version of the Hall voltage with such polarity as to achieve positive reinforcement between the Hall voltage and the superimposed field-induced voltage. The amount of positive feedback is controlled by the differential gain between the Hall sense terminals and the field plates. For small differential gain, the magnetic responsivity is increased. When the product of the differential amplifier gain and differential field-induced voltage transfer ratio is greater than or equal to one, a latch will result.

In a latching function, hysteresis can be controlled by limiting the dynamic range of the differential amplifier outputs.

To avoid oscillation, the differential amplifier driving the segments of the field plate should have the form of an analog integrator. In this way the infinite gain condition produces a pole at the origin and no instability results. The resulting circuit will change smoothly from a high-gain condition to a latch without oscillation.

The application of positive feedback in this way is not expected to change the basic sensitivity of the Hall element because both the noise (offset) and magnetic response are amplified equally. However, the positive feedback will result in a significant increase in the magnetic responsivity and for large feedback will produce a magnetic latch.

Figure 3:
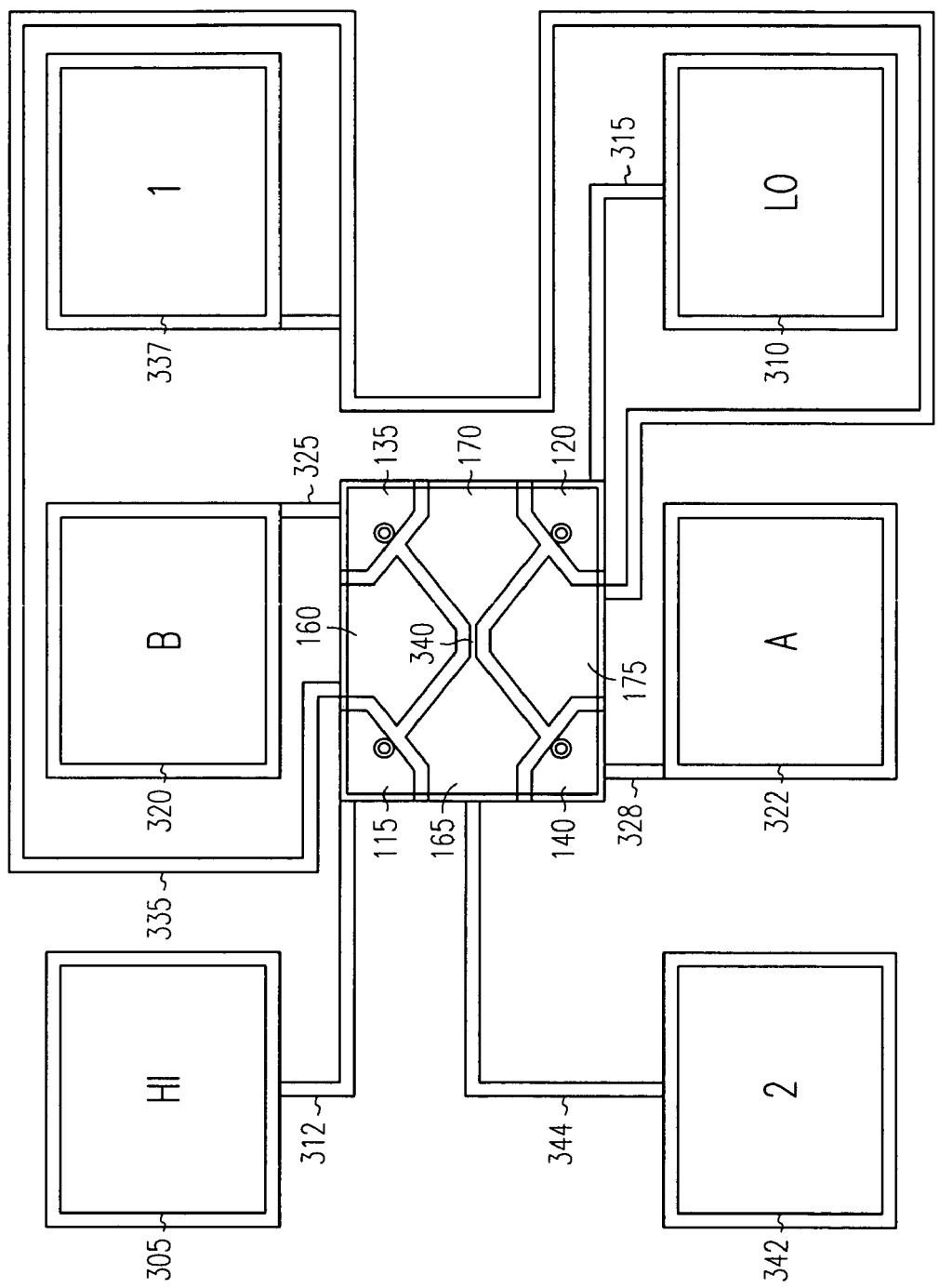
FIG. 3 is a top view of a layout of a Hall sensor according to an embodiment of the invention.

A typical layout of a Hall sensor incorporating a segmented field plate is shown at 300 in FIG. 3. The numbering in FIG. 3 is consistent with the numbering in FIG. 1. Bias contacts 115, 120 of the Hall element are coupled to contact pads 305 and 310 by conductors 312 and 315 respectively. Similarly, the sense contacts 135, 140 are coupled to sense contact pads 320 and 322 by conductors 325 and 328 respectively. Opposing field plate segments 160 and 175 are coupled to each other by a conductor 335 which serpentines around the outside of the layout, and is also coupled to a contact pad 337.

Opposing segmented field plates 165 and 170 are electrically coupled through a direct connection 340 formed of the same material as the field plates. Segments 165 and 170 are also coupled to a contact pad 342 by a conductor 344. In one embodiment, the conductors are also formed of the same material as the field plate segments. In one embodiment, the Hall sensor is constructed using standard integrated circuit processes. Metal interconnect layers are patterned to define individual field plates and provide electrical connections to other circuit elements.

In various embodiments, the field plates may cover substantially the entire Hall element, but should be at least partially electrically isolated from each other. In further embodiments, significantly less of the Hall element is covered by each of the field plates. In still further embodiments, more than four field plate segments may be utilized and electrical connections between them may be configured differently in various embodiments.

A field plate for a Hall element is partitioned into a plurality of individual plates. Dynamic bias control is applied to the field plates by the use of a feedback signal derived from an amplified output of the Hall element. The feedback controls sheet conductivity of the Hall element in specific localized areas. In one embodiment, a superimposed analog of the Hall-effect magnetic response is provided by unbalancing the conductance of the Hall element acting like a Wheatstone bridge. Under conditions of low-level positive feedback, overall magnetic sensitivity is enhanced and linearity is maintained. Beyond a critical level, positive feedback produces a latching function with hysteresis. To reset the latch, a strong reverse magnetic field may be used. In further embodiments, removing the feedback or reversing the polarity of the feedback by using switches is utilized to reset the latch. The sense contacts are controllably shorted together in a further embodiment to reset the latch. Dynamic bias control may be applied to sensors with either analog or digital outputs. High gain amplification and Schmitt trigger functions may be implemented using fewer circuit elements.

In one embodiment, negative feedback to the field plates may be used to improve linearity of the amplified response.

What is claimed is:

1. A Hall sensor comprising:
   a Hall element supported by a substrate;
   an insulating layer disposed over the Hall element;
   a segmented field plate positioned over the Hall element; and
   feedback connection between sense outputs of the Hall element and the segmented field plate.

2. The Hall sensor of claim 1 and further comprising an amplifier coupled to the feedback connections between the sense outputs of the Hall element and the segmented field plate.

3. The Hall sensor of claim 2 wherein the feedback causes the Hall sensor to act as a latch.

4. The Hall sensor of claim 2 wherein the feedback causes a linear response of the Hall sensor.

5. The Hall sensor of claim 1 wherein the segmented field plate comprises four segments.

6. The Hall sensor of claim 5 wherein Hall element is substantially rectangular in shape and the segments are disposed in four separate quadrants defined by lines extending between opposite corners of the Hall element.

7. The Hall sensor of claim 6 wherein opposing diagonal segments are electrically connected.

8. The Hall sensor of claim 7 wherein the Hall element comprises a positive bias corner, a negative bias corner, a positive sense corner and a negative sense corner, and wherein a differential feedback signal is provided to the pair of electrically connected, diagonally opposed segments.

9. The Hall sensor of claim 1 wherein the segmented field plate comprises two segments.

10. The Hall sensor of claim 9 wherein Hall element is substantially square in shape and the segments each substantially cover two diagonally adjacent quadrants of the Hall element.

11. A Hall sensor comprising:
    a Hall element supported by a substrate, wherein the Hall element has a pair of sense outputs;
    an insulating layer disposed over the Hall element;
    a segmented field plate positioned over the Hall element; and
    an amplifier coupled to the sense outputs of the Hall element, the amplifier having outputs coupled to the segmented field plate.

12. The Hall sensor of claim 11 wherein the amplifier comprises a fully differential amplifier.

13. The Hall sensor of claim 12 wherein the amplifier has a gain of between approximately 200 and 500.

14. A Hall sensor comprising:
    a rectangular Hall element supported by a substrate, wherein the Hall element has a pair of sense outputs in opposing corners and a pair of bias outputs in opposing corners;
    an insulating layer disposed over the Hall element;
    a four way segmented field plate positioned over separate quadrants of the Hall element defined by lines between opposing corners, wherein diagonally opposed field plates are electrically coupled; and an amplifier coupled to the sense outputs of the Hall element, the amplifier having outputs coupled to the segmented field plate.

15. The Hall sensor of claim 14 wherein the Hall element comprises a positive bias corner, a negative bias corner, a positive sense corner and a negative sense corner, and wherein a differential feedback signal from the amplifier is presented to the pair of electrically connected, diagonally opposed segments.

16. A Hall sensor comprising:
a Hall element supported by a substrate;
an insulating layer disposed over the Hall element;
a segmented field plate positioned over the Hall element, wherein the segments are electrically isolated from each other; and
feedback connections between sense outputs of the Hall element and the segmented field plate.

17. The Hall sensor of claim 16 wherein the Hall element is formed with an N-doped layer of semiconductor supported by a P-doped substrate.

18. The Hall sensor of claim 17 wherein the insulating layer comprises silicon dioxide.

19. A method comprising:
segmenting a field plate over a Hall element;
electrically isolating segments of the field plate from each other; and
providing feedback to selected segments from sense contacts of the Hall element.

20. The method of claim 19 wherein the feedback is positive.

21. The method of claim 20 and further comprising amplifying the feedback to cause latching of the Hall element.

22. The method of claim 20 and further comprising amplifying the feedback to enhance magnetic responsivity while maintaining linearity.

23. The method of claim 19 wherein the feedback is negative.

24. The method of claim 23 and further comprising controlling the feedback to enhance linearity.

* * * * *